(12) United States Patent
Felder et al.

(10) Patent No.: US 9,831,973 B2
(45) Date of Patent: Nov. 28, 2017

(54) METHOD AND APPARATUS FOR CONTROLLING A MULTICHANNEL TDM DEVICE

(71) Applicant: MAXIM Integrated Products, Inc., San Jose, CA (US)

(72) Inventors: Matthew D. Felder, Austin, TX (US); Brian D. Trotter, Austin, TX (US)

(73) Assignee: Maxim Intergrated Products, Inc., San Jose, CA (US)

( * ) Notice: Subject to any disclaimer, the term of this patent is extended or adjusted under 35 U.S.C. 154(b) by 387 days.

(21) Appl. No.: 14/280,600

(22) Filed: May 17, 2014

(65) Prior Publication Data

US 2014/0341230 A1    Nov. 20, 2014

Related U.S. Application Data

(60) Provisional application No. 61/825,514, filed on May 20, 2013.

(51) Int. Cl.
*H04J 3/16* (2006.01)
*H03F 3/20* (2006.01)
*H03F 3/217* (2006.01)

(52) U.S. Cl.
CPC .............. *H04J 3/1694* (2013.01); *H03F 3/20* (2013.01); *H03F 3/217* (2013.01)

(58) Field of Classification Search
CPC .......... H04J 3/1694; H04J 3/12; H04J 3/1682; H04J 3/0647; H04B 3/542; H04L 12/40; H04L 12/4035; H04Q 2213/13292; H04Q 11/04; H04Q 2213/13031; H04Q 2213/13034; G03F 3/20; G03F 3/217

See application file for complete search history.

(56) References Cited

U.S. PATENT DOCUMENTS

| | | | | |
|---|---|---|---|---|
| 5,212,688 A | * | 5/1993 | Gerbehy | H04J 3/08 370/509 |
| 5,384,776 A | * | 1/1995 | Gulliford | H04W 84/08 370/438 |
| 5,406,634 A | * | 4/1995 | Anderson | H04R 27/00 381/80 |
| 5,642,358 A | * | 6/1997 | Dent | H01Q 1/288 342/51 |
| 5,949,762 A | * | 9/1999 | Green | H04M 11/06 370/259 |
| 7,042,908 B1 | * | 5/2006 | Mayer | H04J 3/076 370/503 |
| 2004/0095952 A1 | * | 5/2004 | Zhang | G06F 13/4291 370/438 |

(Continued)

*Primary Examiner* — Hassan Kizou
*Assistant Examiner* — Roberta A Shand
(74) *Attorney, Agent, or Firm* — TIPS Group

(57) ABSTRACT

A method for developing TDM data with embedded control data includes obtaining signal data and control data, formatting the signal data and the control data into a plurality of channels of a DIN signal, and transmitting the DIN signal on one line of a 3-bit TDM bus. A multichannel input device includes a control extractor receptive to the three-bit TDM bus and operative to extract CNTL data from the DIN data, a DAI receptive to the 3-bit TDM bus and the channel select input and operative to develop a SIGNAL data output, and a DAC block including a DAC, the DAC block being receptive to the SIGNAL data and the CNTL data.

7 Claims, 4 Drawing Sheets

(56) References Cited

U.S. PATENT DOCUMENTS

2009/0058497 A1\* 3/2009 Johnson .................... G06F 1/22
327/415
2013/0322461 A1\* 12/2013 Poulsen .................... H04J 3/02
370/458

\* cited by examiner

METHOD AND APPARATUS FOR CONTROLLING A MULTICHANNEL TDM DEVICE

CROSS REFERENCE TO RELATED APPLICATION(S)

This application claims the benefit of U.S. Ser. No. 61/825,514, filed May 20, 2013, which is incorporated herein by reference in its entirety.

BACKGROUND

Digitally controlled analog devices include devices such as amplifiers. When used for audio, such devices often include multiple channels. An example of an audio power amplifier is a digital pulse-code modulation (PCM) input Class D power amplifier. Such amplifiers may support time division multiplexed (TDM) data and may also support I2S data. TDM is a type of multiplexing in which two or more bit streams or signals are transferred appearing simultaneously as sub-channels in one communication channel, but physically taking turns on the channel.

I2S (also known as Inter-IC Sound, Integrated Interchip Sound, and IIS) is an electrical serial bus interface standard used for connecting digital audio devices together, e.g. to communicate PCM audio data between integrated circuits. The I2S requires at least three lines: a bit clock line, a word clock line, also known as a word select (WS), channel sync or left-right clock or (LRCLK) line, and at least one multiplexed data line.

The I2S digital interface with BCLK, LRCLK, and DIN are commonly used in most digital audio systems. The interface allows for a multiple channels of data to be sent over the shared DIN line. Each frame of data is aligned with the LRCLK signal. The DIN data within that frame can be any number of TDM channels with any number of bit depths.

Devices (a/k/a "parts", "output channels", and the like) typically need to be programmed for the type of digital interface. Typically, a device will be programmed for the format of the TDM data using Inter-Integrated Circuit or "I2C" protocol. The I2C protocol uses two bidirectional, open-drain lines, known as the Serial Data Line (SDA) and the Serial Clock Line (SCL) that are pulled up with resistors to Vcc, e.g. 3.3 or 5 volts d.c. However, such programming of the data formatting can make the system more complex and, in some cases as described below, there may not be enough pins (a/k/a "leads", "contacts", "balls", "pads", etc.) to support an I2C interface for such programming.

Some audio amplifier integrated circuits (ICs) are quite small and include only a few contacts on the IC package. These small ICs are useful in compact electronic devices such as cellular telephones, tablets and notebook computers. For example, a small wafer level package (WLP) may have only nine contacts (sometimes called "pads" or "balls") for interconnection with a printed circuit board. Providing I2C capabilities to such small packages can be problematical do to the limited number of available pads and, in some cases, there aren't enough contacts to support an I2C interface for the purpose of programming, even though an I2C interface only requires a couple of dedicated pins.

The problem of providing multiple data lines, such as I2S lines, to analog/digital devices having few leads, contacts, pads or the like extends beyond audio power amplifier devices, which were set forth only by way of example. The usual solution is to put such analog/digital devices in larger packages with more pins, which increases the form factor of the IC.

These and other limitations of the prior art will become apparent to those of skill in the art upon a reading of the following descriptions and a study of the several figures of the drawing.

SUMMARY

In an embodiment, set forth by way of example and not limitation, a multichannel input device system with TDM bus includes a three-bit TDM bus providing TDM channel embedded control data and a plurality of multichannel input devices each coupled to, and deriving their control data from, the three-bit TDM bus. In an example embodiment, the three-bit TDM bus includes SYNC, CLK and DIN lines, where the DIN line carries DIN data including SIGNAL data and CNTL data.

In an embodiment, set forth by way of example and not limitation, a multichannel input device includes: a control extractor receptive to the three-bit TDM bus and operative to extract CNTL data from the DIN data; a DAI receptive to the 3-bit TDM bus and to a channel select (CS) input and operative to develop a SIGNAL data output; and a DAC block including a DAC, the DAC block being receptive to the SIGNAL data and the CNTL data. In certain embodiments the DAC block includes an analog device coupled to an output of the DAC.

In an embodiment, set forth by way of example and not limitation, a method for developing TDM data with embedded control data includes: obtaining signal data and control data; formatting the signal data and the control data into a plurality of channels of a DIN signal; and transmitting the DIN signal on one line of a 3-bit TDM bus. In an example formatting process, one channel of the DIN signal is used as a designated control channel to control a plurality of output channels (e.g. devices) having a corresponding plurality of data channels.

An advantage of certain example embodiments is that a multiple data channel TDM device can be controlled without using an I2C control bus or the like. As a result, fewer pins are required for the IC package, allowing for a smaller form factor.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

A multichannel input device 10, set forth by way of example and not limitation, includes a detector 12, a digital audio interface DAI 14, a digital-to-analog converter DAC 16, and an analog device 18. The detector 12, in this non-limiting example, has a BCLK input, a LRCLK input, a number of channels NCHAN output and a bit depth B output. In this example embodiment, LRCLK is representative of a channel sync signal for an I2S mode, it being understood by one of skill in the art that there are other types of channel sync signals that can be used in other example embodiments. For example, in a TDM mode, the channel sync signal is not a left/right sync signal and, therefore, is usually simply referred to as "a channel sync signal." The DAI 14 has a data DIN input, a BCLK input, a LRCLK input, and NCHAN input and a B input. The DAI 14 is operative to output digital data associated with an assigned channel. The DAC 16 converts the digital data of the DAI to an analog signal, which is input into the analog device 18.

The analog device 18 can be, by way of non-limiting example, a class D audio amplifier. The DAI 14, DAC 16 and analog device 18 can be, by way of example, comparable to the digital audio interface, DAC and Class D Output Stage as set forth in the datasheet for MAX98355A/MAX98355B dated May, 2012, which is incorporated herein by reference in its entirety.

Figure 2:
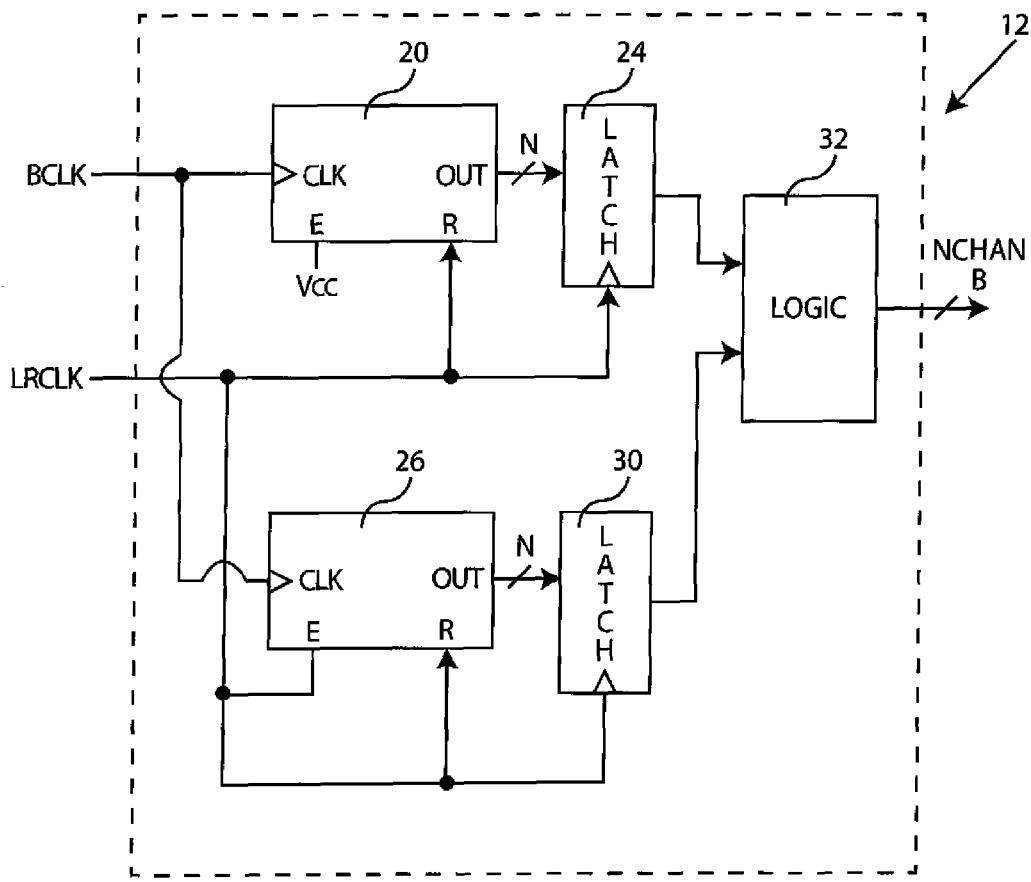
FIG. 2 is a block diagram, set forth by way of example and not limitation, of a detector of FIG. 1.

In FIG. 2, a detector 12, set forth by way of example and not limitation, includes a first counter 20 and a first latch register 24 for counting a number N1 of BCLK cycles for one LRCLK clock. The example detector 12, by way of further example, also includes a second counter 26, and a second latch register 30 for counting a number N2 of BCLK cycles when LRCLK is HI This is accomplished by coupling the enable input of counter 26 to LRCLK such that the counter 26 stops counting when LRCLK goes LO. The outputs of the latch register 24 and the latch register 30 are used by logic 32 to determine the number of channels NCHAN and the bit depth B.

Figure 3:
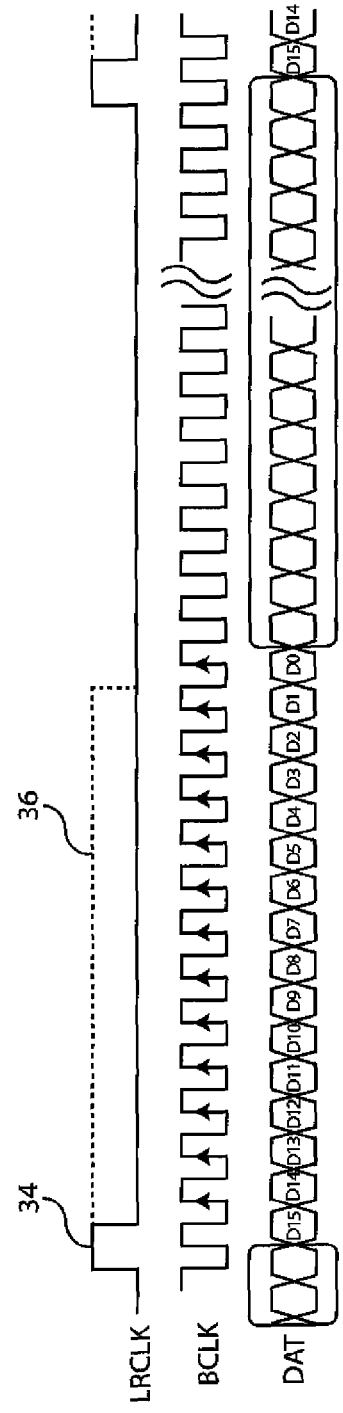
FIG. 3 is a timing diagram of example LRCLK, BCLK and DIN signals.

FIG. 3 is a timing diagram of example LRCLK, BCLK and DIN signals. The solid line pulse 34 illustrates a traditional LRCLK pulse for TDM interface, where the LRCLK pulse is one BCLK cycle in length. The broken line pulse 36 illustrates an alternative LRCLK pulse which encodes a bit depth B in the duty cycle of the LRCLK channel sync signal. In further alternate embodiments, arbitrary data can be encoded in a sequence of LRCLK duty cycle lengths (e.g. gain control, filtering options, power sequencing, sample rate, etc.)

Figure 4:
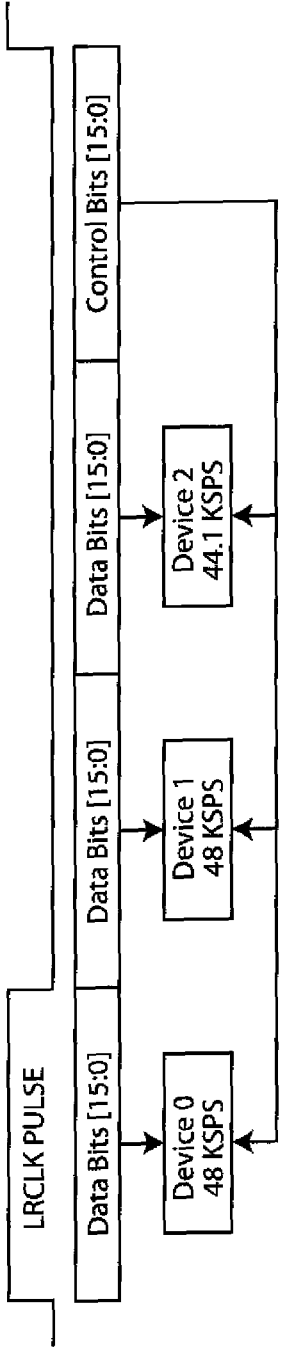
FIG. 4 is diagram of an embodiment, set forth by way of example and not limitation, of a channel of TDM data which can be used as a common control channel for multiple output channels that each has their own data channel.

FIG. 4 is a diagram of an embodiment, set forth by way of example and not limitation, of a channel of TDM data which can be used as a common control channel for multiple output channels that each has their own data channel. That is, in a multiple channel TDM applications it would be helpful to have a shared control channel for multiple devices. By way of non-limiting example, one channel of the TDM data to be used as a common control channel to be used for multiple output channels that each has their own data channel. In an example, the common control channel could be predetermined or programmed as a pin option (e.g. highest or lowest channel). In certain embodiments, allows all channels to be adjusted for sample rate, gain, mute, etc., by way of non-limiting examples.

Figure 5:
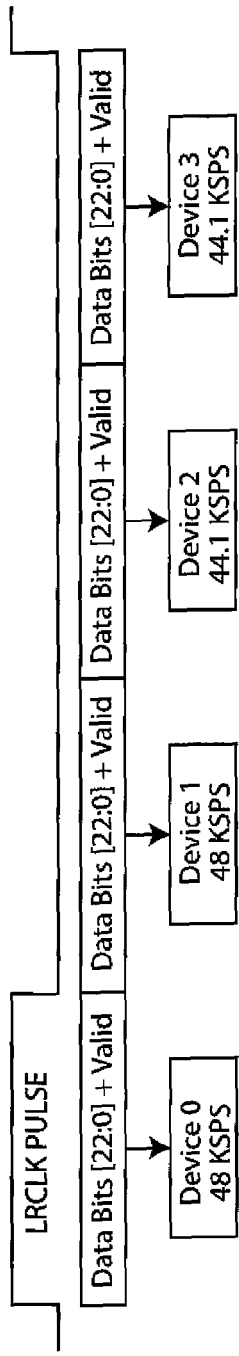
FIG. 5 is a diagram of an embodiment, set forth by way of example and not limitation, of the use of lower least significant bits (LSBs) for control signals.

FIG. 5 is a diagram of an embodiment, set forth by way of example and not limitation, of the use of lower least significant bits (LSBs) for control signals. By way of non-limiting example, in certain applications with 24 or 32 bits per channel the LSB's are often not needed. These lower LSBs can, in certain embodiments, be used for control signals which could include VALID DATA, GAIN, SAMPLE RATE, MUTE, etc. By way of non-limiting example, a VALID DATA bit can be used to allow different sample rate data to be sent over the same TDM interface by "stuffing" lower sample rate channels with ignored samples.

Figure 1:
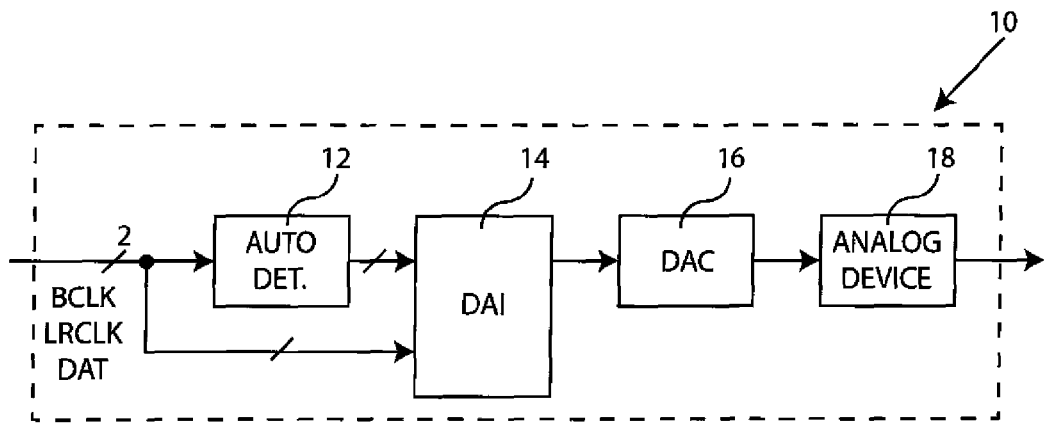
FIG. 1 is a block diagram, set forth by way of example and not limitation, of a multichannel input device.
Figure 6:
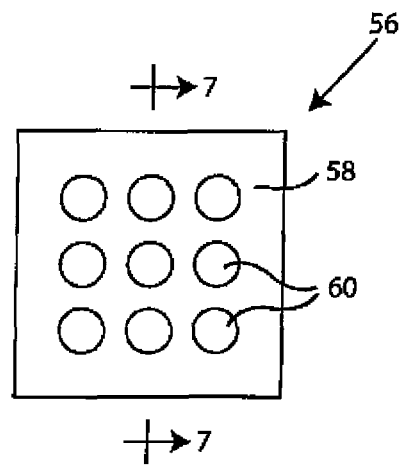
FIG. 6 is a bottom plan view of an integrated circuit (IC) package suitable for use with the multichannel input device of FIG. 1.
Figure 7:
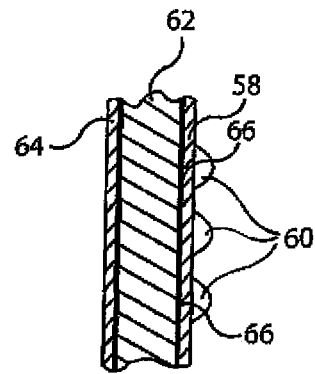
FIG. 7 is a cross sectional view taken along line 7-7 of FIG. 6.

FIG. 6 is a bottom plan view of and integrated circuit (IC) 56 incorporating a multichannel input device 10 of FIG. 1, and FIG. 7 is a cross sectional view of IC 56 taken along line 7-7 of FIG. 6. IC 56, in this non-limiting example, is a wafer-level packaging (WLP) IC which can be manufactured by building up the package interconnect structure directly on the silicon circuit substrate. By way of non-limiting example, a dielectric repassivation polymer film 58 can be applied over an active surface of a wafer, die or "chip" 62 typically comprising silicon. The film 58 preferably provides both mechanical stress relief for the ball 60 attachment and electrical isolation on the die surface. Electrically conductive vias 66 can be imaged within the polymer film 58, providing electrical contact to the IC bonding pads. Backside wafer lamination 64, which can be a protective polymer film, can provide both mechanical and UV light protection of the backside of the die.

It will therefore be appreciated that an integrated circuit device 56 can include an integrated circuit chip 62, an insulating package 58/64 enclosing the integrated circuit chip 62, and a plurality of contacts 60 and vias 66 extending through the insulating package and electrically coupled to the integrated circuit chip 62. In this non-limiting example, a WLP package is used, although other packages can be used as will be appreciated by those of skill in the art. In this example, the contacts are provided by a set of conductive contact balls ("contacts") 60 arranged in a square array of 3×3, for a total of 9 contacts.

It will be appreciated that, in the prior art, a TDM data bus for an audio integrated circuit (IC) device included at least three lines (e.g. SYNC, CLK, DIN) and an I2C control bus having two additional two lines (CLK, DATA). Therefore, five contacts of the audio IC device were required to support the TDM data bus operation. Since there are a number of other contacts also required for the audio IC device, such as analog output contacts, power and ground contacts, channel select inputs, etc., generally 10 or more contacts are required, which is more than the 9 contacts of a WLP package. The elimination of the two contacts required for I2C control can, in certain cases, reduce the number of contacts required, allowing the use of a WLP package. Such small IC packages are favored for compact and miniaturized devices, such as cell phones.

The control data that is typically carried by I2C buses include such controls data ("signals") as gain, mute, power-down, etc. It is to be noted that, typically, multiple audio IC devices are coupled to a single I2C bus, e.g. when there are multiple audio channels. Some control data might need to go a single channel, while other control signals would apply to all devices. With I2C, the control data has to be sent to each IC device in sequence if all of them were to be affected. That is, I2C does not have the capability of "global addressing" where multiple IC devices are addressed concurrently.

With the methods set forth above in the descriptions of FIGS. 4 and 5 the I2C bus can be eliminated, saving the need for two pins of an IC package. Furthermore, these methods can control all devices ("channels") with one control setting (see, for example, FIG. 5) and also can control a single channel ("device") and/or one sample of DATA for that single channel (e.g. a valid data bit).

Figure 8:
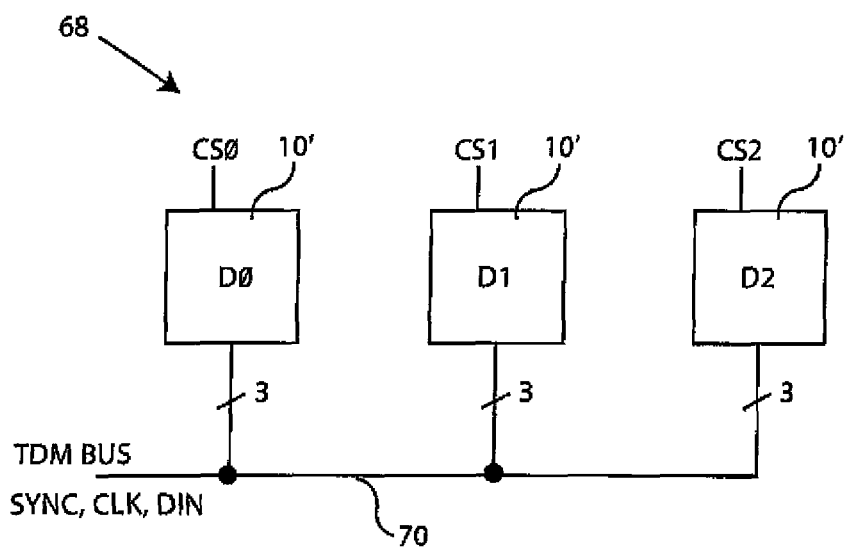
FIG. 8 is a block diagram, set forth by way of example and not limitation, illustrating a multichannel TDM system.

FIG. 8 is a block diagram, set forth by way of example and not limitation, illustrating a multichannel TDM system 68 including a number of multichannel input devices 10' (labelled individually as devices D0, D1 and D2) coupled to a 3 bit TDM bus 70 with TDM channel embedded control data. In this non-limiting example, the TDM bus includes SYNC, CLK and DIN lines, where the DIN line carries DIN data including SIGNAL data and CNTL data. The CNTL data embedded in the DIN data eliminates the need for a separate control bus, such as an I2C control bus, thereby reducing the number of leads required for the multichannel input devices 10' by two. Each of multichannel input devices 10' are provided with a channel select (CS) input, e.g. CS0 for device D0, CS1 for device D1, and CS2 for device D2. The channel select input can be, in certain example embodiments, a single pin on the device's package, such that a particular channel number can be selected by providing different voltage levels to the pin.

Figure 9:
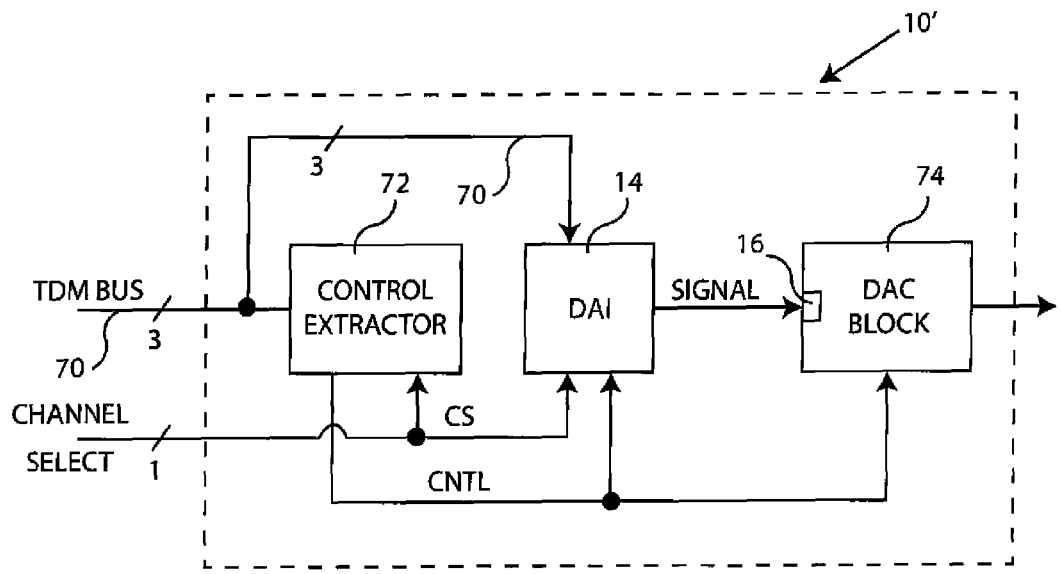
FIG. 9 is a block diagram, set forth by way of example and not limitation, illustrating a multichannel input device with TDM channel embedded control data.

FIG. 9 is a block diagram, set forth by way of example and not limitation, illustrating a multichannel input device 10' with TDM channel embedded control data. The multichannel input device 10' includes a control extractor 72, a DAI 14, a DAC block 74 including a DAC 16. It should be noted that, in this example embodiment, DAC block 74 may consist of DAC 16 (e.g. the output of the DAC block 74 is the output of the DAC 16), or may comprise DAC 16 and at least one additional analog device (such as analog device 18 of FIG. 1) coupled to an output of DAC 16. The TDM bus 70 is input into control extractor 72 and DAI 14, and a channel select (CS) line is input into DAI 14 and control extractor 72, in this non-limiting embodiment. In other embodiment, the CS line is not input into the control extractor. Control extractor 72 uses logic (e.g. hardware logic or programmed logic) to extract the CNTL data from the DIN data which is input into the DAI 14 and DAC block 74. The DAI 14 extracts the SIGNAL data from the DIN data and applies it to an input of DAC 16 of DAC block 74.

Figure 10:
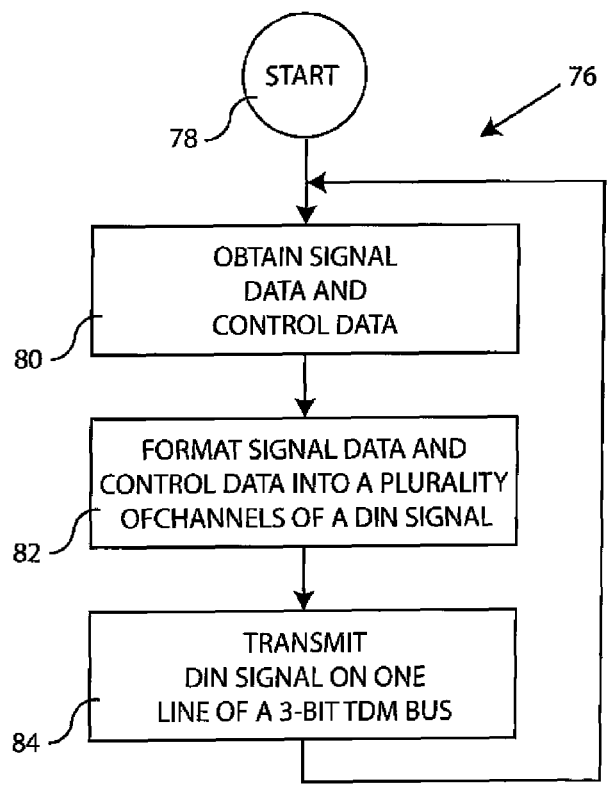
FIG. 10 is a flow diagram of a method for developing TDM data with embedded control data.

FIG. 10 is a flow diagram, set forth by way of example and not limitation, of a method ("process") 76 for developing TDM data with embedded control data. Process 76 begins at 78 and, in an operation 80, signal data and control data are obtained. Next, in an operation 82, the signal data and the control data are formatted into a number of channels of a DIN signal. Then, in an operation 84, the DIN signal is transmitted on one line of a 3-bit TDM bus. Control then returns to operation 80 to repeat the process until its conclusion.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the following appended claims be interpreted in accordance with the true spirit and scope of the invention without limitation or estoppel.

What is claimed is:

1. A multichannel input device system with TDM bus comprising:
    a three-bit TDM bus providing TDM channel embedded control data, wherein the three-bit TDM bus includes SYNC, CLK and DIN lines, where the DIN line carries DIN data including SIGNAL data and CNTL data; and
    a plurality of multichannel input devices each coupled to, and deriving their control data from, the three-bit TDM bus;
    wherein each of the plurality of multichannel input devices includes
        a control extractor receptive to the three-bit TDM bus and operative to extract CNTL data from the DIN data;
        a DAI receptive to the 3-bit TDM bus and to a channel select (CS) input and operative to develop a SIGNAL data output; and
        a DAC block including a DAC and an analog device coupled to an output of the DAC, the DAC block being receptive to the SIGNAL data and the CNTL data; and
    wherein each of the plurality of multichannel input devices is formed on an integrated circuit (IC) chip that is disposed in an IC package having no more than nine contacts.

2. A multichannel input device comprising:
    a control extractor receptive to a three-bit TDM bus including SYNC, CLK and DIN lines, where the DIN line carries DIN data including CNTL data, wherein the control extractor is operative to extract the CNTL data from the DIN data;
    a DAI receptive to the 3-bit TDM bus and to a channel select input and operative to develop a SIGNAL data output, wherein the channel select input is also coupled to the control extractor; and
    a DAC block including a DAC and an analog devices coupled to an output of the DAC, the DAC block being receptive to the SIGNAL data and the CNTL data;
    wherein the extractor, DAI, DAC and analog device are formed on an integrated circuit (IC) chip which is disposed in an IC package having no more than nine contacts.

3. A method for developing TDM data with embedded control data comprising:
    obtaining signal data and control data;
    formatting the signal data and the control data into a plurality of channels of a DIN signal by designating one channel of the DIN signal to be used as a designated control channel and using the designated control channel for a plurality of output channels having a corresponding plurality of signal data channels; and
    transmitting the DIN signal on one line of a 3-bit TDM bus, wherein the DIN signal is transmitted serially;

wherein there are at least three signal data channels associated with at least three output channels and wherein each signal data channel is as wide as an LRCLK pulse.

4. A method for developing TDM data with embedded control data as recited in claim 3 wherein the control channel includes at least one of a VALID DATA, GAIN, SAMPLE RATE and MUTE command.

5. A method for controlling a multiple data channel TDM device as recited in claim 3 wherein formatting includes:
   identifying unused least significant bits (LSBs) of the TDM data; and
   embedding one or more control signals in the LSBs.

6. A method for controlling a multiple data channel TDM device as recited in claim 5 wherein the control signals include at least one of a VALID DATA, GAIN, SAMPLE RATE and MUTE command.

7. A method for controlling a multiple data channel TDM device as recited in claim 5 wherein different sample rate data can be sent over the same TDM interface by stuffing lower sample rate channels with ignored samples.

* * * * *